(12) United States Patent
McLellan et al.

(10) Patent No.: US 7,226,811 B1
(45) Date of Patent: Jun. 5, 2007

(54) PROCESS FOR FABRICATING A LEADLESS PLASTIC CHIP CARRIER

(75) Inventors: Neil McLellan, Danville, CA (US); Chun Ho Fan, Hong Kong (HK); Kin Pui Kwan, Hong Kong (HK); Wing Him Lau, Hong Kong (HK)

(73) Assignee: ASAT Ltd., Tsuen Wan, New Territories (HK)

( * ) Notice: Subject to any disclaimer, the term of this patent is extended or adjusted under 35 U.S.C. 154(b) by 6 days.

(21) Appl. No.: 11/175,663

(22) Filed: Jul. 6, 2005

Related U.S. Application Data

(60) Division of application No. 10/697,339, filed on Oct. 30, 2003, now Pat. No. 6,946,324, which is a continuation-in-part of application No. 09/802,678, filed on Mar. 9, 2001, now Pat. No. 6,933,594, which is a continuation-in-part of application No. 09/288,352, filed on Apr. 8, 1999, now Pat. No. 6,948,099, which is a continuation-in-part of application No. 09/095,803, filed on Jun. 10, 1998, now Pat. No. 6,229,200.

(51) Int. Cl.
*H01L 21/44* (2006.01)
(52) U.S. Cl. .................. 438/111; 438/113; 438/460; 438/33
(58) Field of Classification Search .......... 438/33, 438/111–113, 123, 460, 637, 672; 257/666, 257/672–676, 787
See application file for complete search history.

(56) References Cited

U.S. PATENT DOCUMENTS

| | | | |
|---|---|---|---|
| 4,530,152 A | 7/1985 | Roche et al. |
| 4,685,998 A | 8/1987 | Quinn et al. |
| 5,066,831 A | 11/1991 | Spielerger et al. |
| 5,293,072 A | 3/1994 | Tsuji et al. |
| 5,444,301 A | 8/1995 | Song et al. |
| 5,457,340 A | 10/1995 | Templeton, Jr. et al. |
| 5,710,695 A | 1/1998 | Manteghi |
| 5,777,382 A | 7/1998 | Abbott et al. |
| 5,900,676 A | 5/1999 | Kweon et al. |
| 5,976,912 A | 11/1999 | Fukutomi et al. |
| 6,001,671 A | 12/1999 | Fjelstad |
| 6,057,601 A | 5/2000 | Lau |
| 6,081,029 A | 6/2000 | Yamaguchi |
| 6,093,584 A | 7/2000 | Fjelstad |
| 6,194,786 B1 | 2/2001 | Orcutt |
| 6,229,200 B1 | 5/2001 | McLellan et al. |

(Continued)

FOREIGN PATENT DOCUMENTS

JP   59-208756   11/1984

*Primary Examiner*—Dung A. Le
(74) *Attorney, Agent, or Firm*—Morrison & Foerster LLP

(57) ABSTRACT

A process for fabricating a leadless plastic chip carrier includes laminating a first metal strip to a second metal strip to form a leadframe strip, selectively etching the first metal strip to define at least a row of contact pads, mounting a semiconductor die to either a die attach pad or the second metal strip and wire bonding the semiconductor die to ones of the contact pads, encapsulating a top surface of the leadframe strip in a molding material, removing the second metal strip, thereby exposing the die attach pad and the at least one row of contact pads, and singulating the leadless plastic chip carrier from the leadframe strip.

3 Claims, 15 Drawing Sheets

U.S. PATENT DOCUMENTS

| | | |
|---|---|---|
| 6,238,952 B1 | 5/2001 | Lin |
| 6,294,830 B1 | 9/2001 | Fjelstad |
| 6,306,685 B1 | 10/2001 | Liu et al. |
| 6,459,163 B1 | 10/2002 | Bai |
| 6,489,557 B2 | 12/2002 | Eskildsen et al. |
| 6,498,099 B1 | 12/2002 | McLellan et al. |
| 6,528,877 B2 | 3/2003 | Ernst et al. |
| 6,528,893 B2 | 3/2003 | Jung et al. |
| 6,585,905 B1 | 7/2003 | Fan et al. |
| 6,586,677 B2 | 7/2003 | Glenn |
| 6,635,957 B2 | 10/2003 | Kwan et al. |
| 6,821,821 B2 | 11/2004 | Fjelstad |
| 6,872,661 B1 * | 3/2005 | Kwan et al. ................ 438/689 |
| 2003/0015780 A1 | 1/2003 | Kang et al. |

* cited by examiner

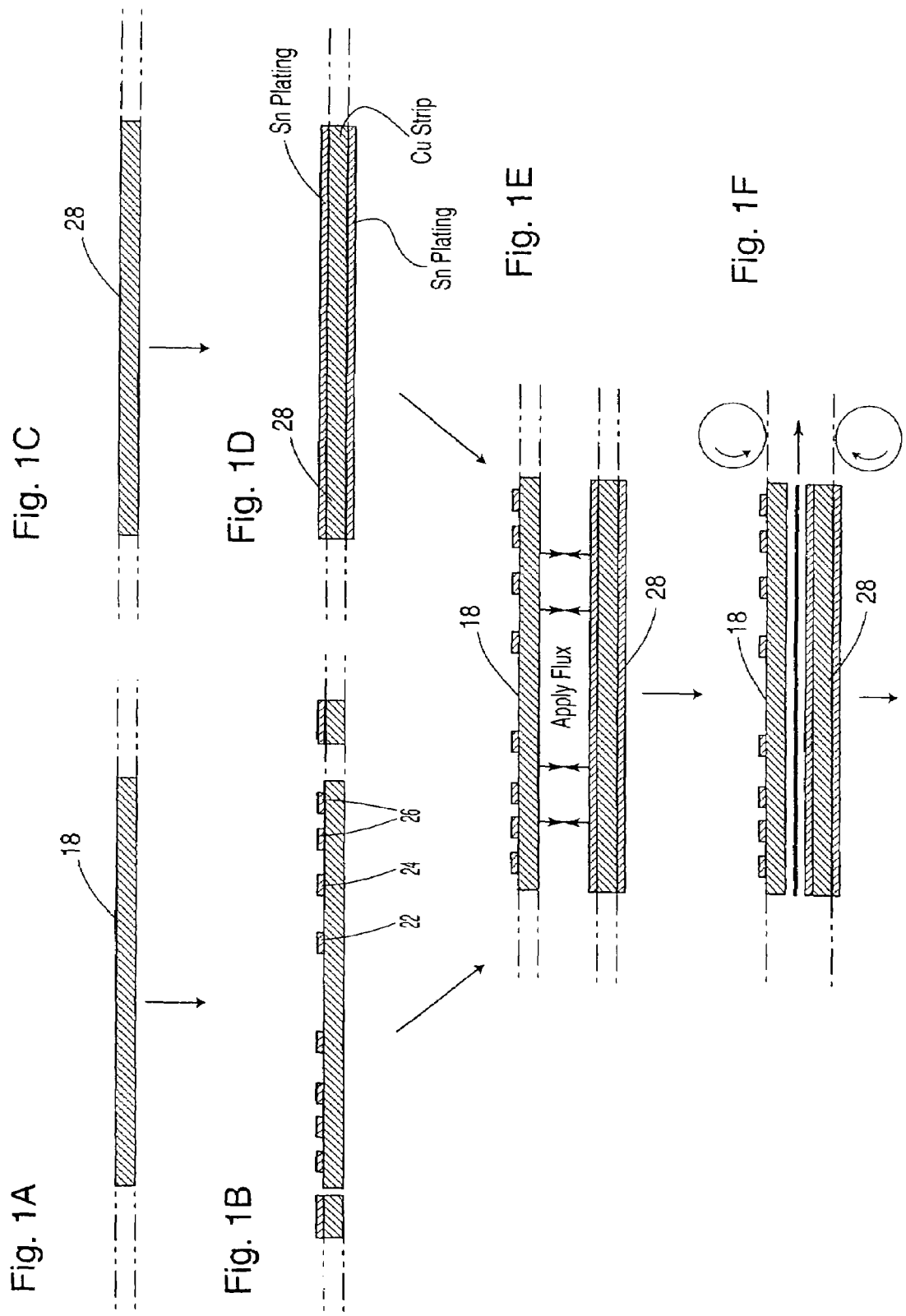

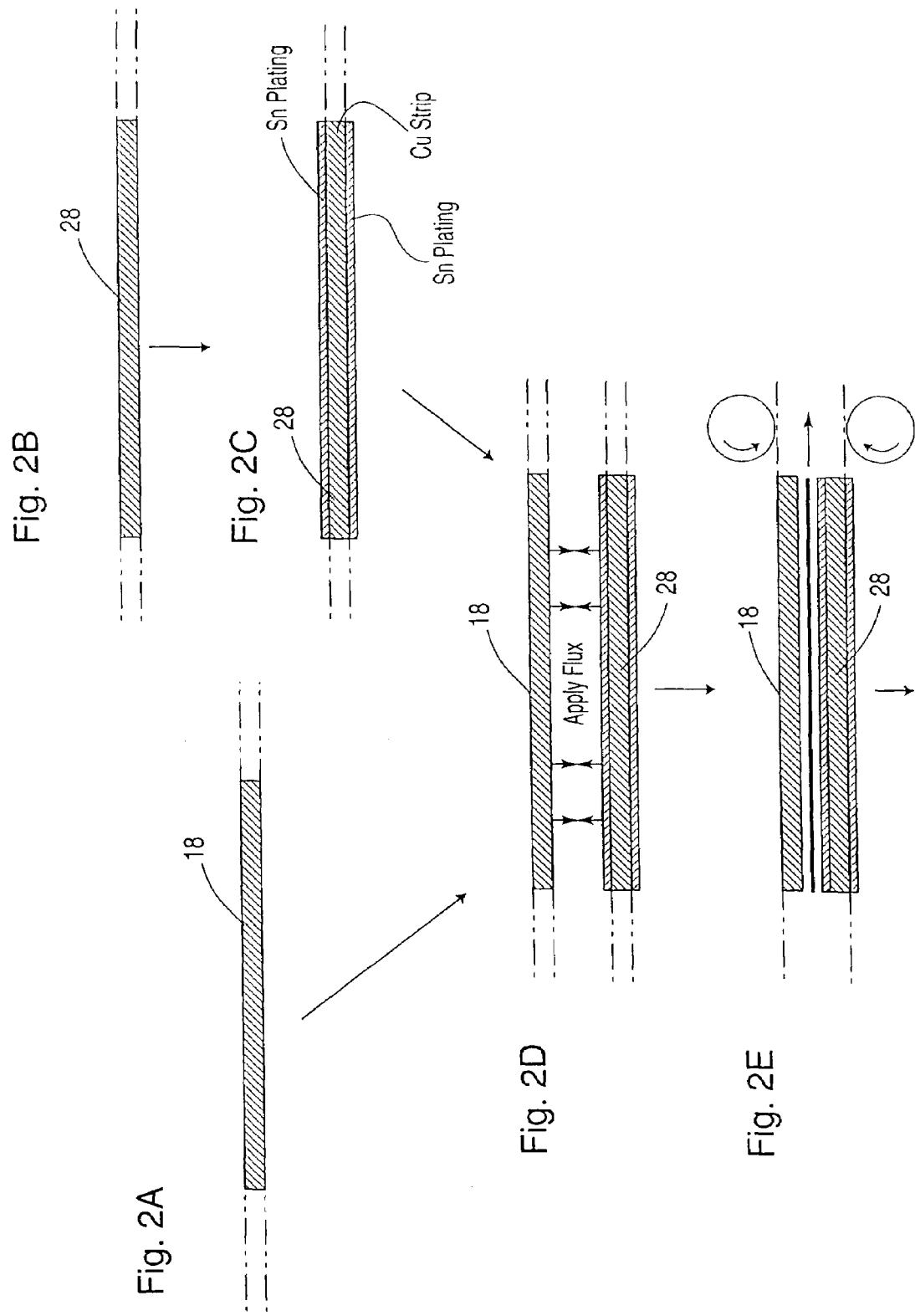

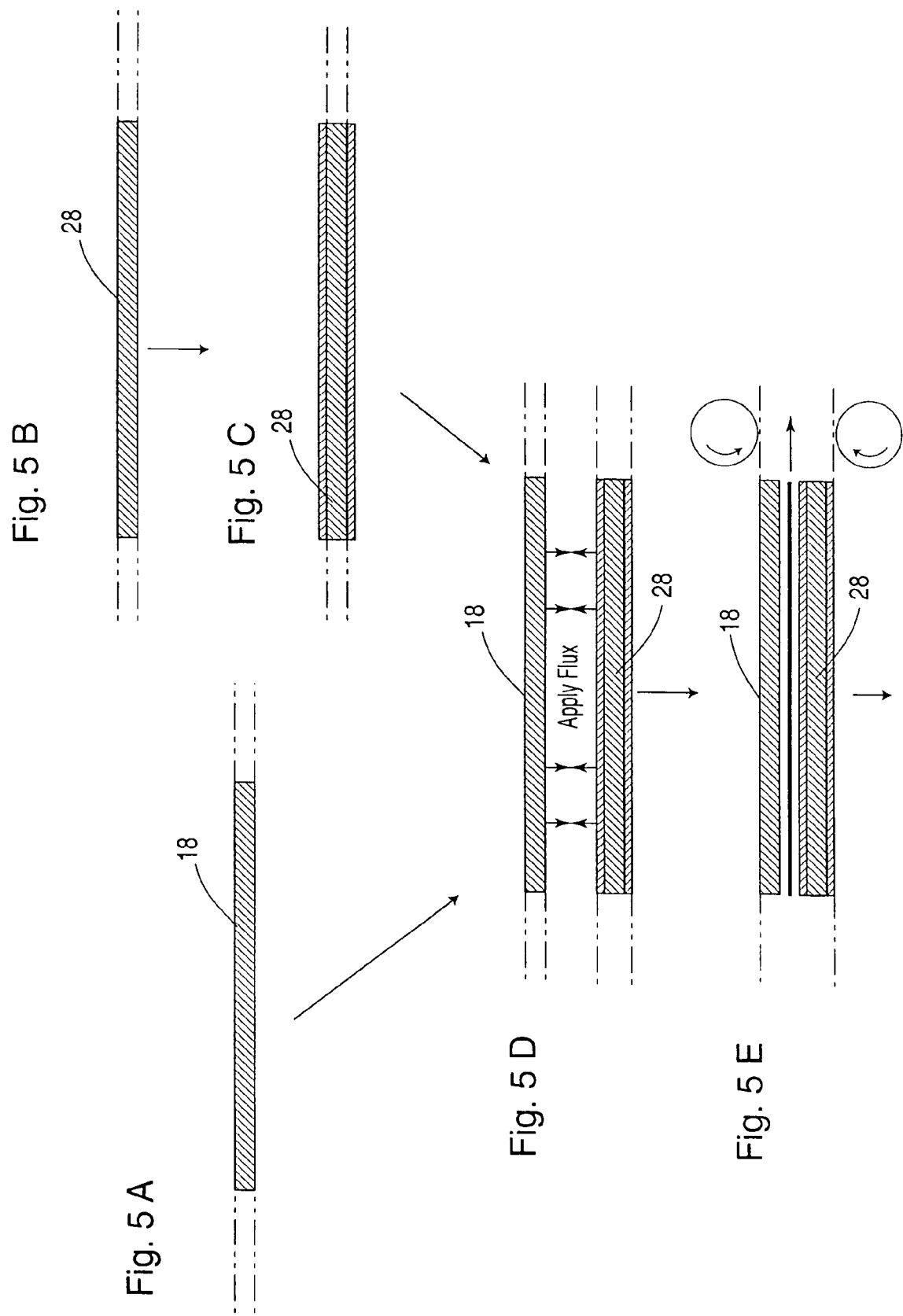

PROCESS FOR FABRICATING A LEADLESS PLASTIC CHIP CARRIER

CROSS REFERENCE TO RELATED APPLICATION

This application is a DIV of Ser No. 10/697,339, Oct. 30, 2003, now U.S. Pat. No. 6,946,324, which is a continuation-in-part of U.S. patent application Ser. No. 09/802,678, filed Mar. 9, 2001, now U.S. Pat. No. 6,933,594, which is a continuation-in-part of U.S. patent application Ser. No. 09/288,352, filed on Apr. 08, 1999 now U.S. Pat. No. 6,498,099, issued Dec. 24, 2002, which is a continuation-in-part of U.S. patent application Ser. No. 09/095,803, filed on Jun. 10, 1998 now U.S. Pat. No. 6,229,200, issued May 8, 2001.

FIELD OF THE INVENTION

The present invention relates in general to integrated circuit packaging, and more particularly to an improved process for fabricating a leadless plastic chip carrier.

BACKGROUND OF THE INVENTION

According to well known prior art IC (integrated circuit) packaging methodologies, semiconductor dice are singulated and mounted using epoxy or other conventional means onto respective die attach pads (attach paddles) of a leadframe strip. Traditional QFP (Quad Flat Pack) packages incorporate inner leads which function as lands for wire bonding the semiconductor die bond pads. These inner leads typically require mold locking features to ensure proper positioning of the leadframe strip during subsequent molding to encapsulate the package. The inner leads terminate in outer leads that are bent down to contact a mother board, thereby limiting the packaging density of such prior art devices.

In order to overcome these and other disadvantages of the prior art, the Applicants previously developed a Leadless Plastic Chip Carrier (LPCC). According to Applicants' LPCC methodology, a leadframe strip is provided for supporting several hundred devices. Singulated IC dice are placed on the strip die attach pads using conventional die mount and epoxy techniques. After curing of the epoxy, the dice are wire bonded to the peripheral internal leads by gold (Au), copper (Cu), aluminum (Al) or doped aluminum wire bonding. The leadframe strip is then molded in plastic or resin using a modified mold wherein the bottom cavity is a flat plate. In the resulting molded package, the die pad and leadframe inner leads are exposed. By exposing the bottom of the die attach pad, mold delamination at the bottom of the die paddle is eliminated, thereby increasing the moisture sensitivity performance. Also, thermal performance of the IC package is improved by providing a direct thermal path from the exposed die attach pad to the motherboard. By exposing the leadframe inner leads, the requirement for mold locking features is eliminated and no external lead standoff is necessary, thereby increasing device density and reducing package thickness over prior art methodologies. The exposed inner leadframe leads function as solder pads for motherboard assembly such that less gold wire bonding is required as compared to prior art methodologies, thereby improving electrical performance in terms of board level parasitics and enhancing package design flexibility over prior art packages (i.e. custom trim tools and form tools are not required). These and several other advantages of Applicants' own prior art LPCC process are discussed in Applicants' U.S. Pat. No. 6,229,200, the contents of which are incorporated herein by reference.

Applicants' LPCC production methodology utilizes saw singulation to isolate the perimeter I/O row as well as multi-row partial lead isolation. Specifically, the leadframe strip is mounted to a wafer saw ring using adhesive tape and saw-singulated using a conventional wafer saw. The singulation is guided by a pattern of fiducial marks on the bottom side of the leadframe strip. Also, special mold processing techniques are used to prevent the mold flow from bleeding onto the functional pad area and inhibiting electrical contact. Specifically, the exposed die pad surface is required to be deflashed after molding to remove any molding compound residue and thereby allow the exposed leads and die attach pad to serve as solder pads for attachment to the motherboard.

According to Applicants' U.S. Pat. No. 6,498,099, the contents of which are incorporated herein by reference, an etch back process is provided for the improved manufacture of the LPCC IC package. The leadframe strip is first subjected to a partial etch on one or both of the top and bottom surfaces in order to create a pattern of contact leads (pads) and a die attach pad (paddle). After wire bonding the contacts to a singulated semiconductor die, followed by overmolding and curing of the mold, the leadframe strip is exposed to a second full etch immersion for exposing the contact pads in an array pattern (i.e. multi-row) or perimeter pattern (i.e. single row), as well as the die attach pad. In the case of a package with multi-row I/O leads, this etch back step eliminates the requirement for two additional saw singulation operations (i.e. to sever the inner leads from the outer leads), and in both the single-row and multi-row configurations, the etch back step eliminates post mold processing steps (e.g. mold deflashing) and ensures superior device yield over the processing technique set forth in Applicants' U.S. Pat. No. 6,229,200. Additionally, using this technique allows for higher I/O pad density and also allows for pad standoff from the package bottom which reduces stress in the solder joint during PCB temp cycling. Further, the technique allows for the use of a pre-singulation strip testing technique given that the electrical I/O pads are now isolated from each other and testing in strip can take place. This feature greatly increased the handling and throughput of the test operation.

In Applicant's co-pending U.S. application Ser. No. 09/802,678, Entitled Leadless Plastic Chip Carrier With Etch Back Pad Singulation, filed Mar. 9, 2001, the contents of which are incorporated herein by reference, the etch-back LPCC process of Applicants' U.S. Pat. No. 6,498,099 is modified to provide additional design features. The leadframe strip is selectively covered with a thin layer photo-resist mask in predetermined areas. Following the application of the mask, an etch-barrier is deposited as the first layer of the contact pads and die attach pad, followed by several layers of metals which can include for example, Ni, Cu, Ni, Au, and Ag. This method of formation of the contact pads allows plating of the pads in a columnar shape and into a "mushroom cap" or rivet-shape as it flows over the photo-resist mask. The shaped contact pads are thereby locked in the mold body, providing superior board mount reliability. Similarly, the die attach pad can be formed in an interlocking shape for improved alignment with the die. The photo-resist mask is then rinsed away and the semiconductor die is mounted to the die attach pad. This is followed by gold wire bonding between the semiconductor die and the peripheral contact pads and then molding as described in Applicant's U.S. Pat. No. 6,229,200. The leadframe is then subjected to full immersion in an alkaline etchant that exposes a lower surface of an array of the contact pads, a power ring and the die attach pad, followed by singulation of the individual unit from the full leadframe array strip.

These processes include the deposition or plating of either a thick layer of metal, or a plurality of layers of metal to form a robust three-dimensional construction of contact pads and the die attach pad. The deposition of successive layers of metal can be time consuming and relatively expensive and still further improvements in manufacturing are driven by industry demand.

It is desirable to provide an improved process for manufacturing a leadless plastic chip carrier using an etch-back step rather than a deposition stage or stages.

SUMMARY OF THE INVENTION

In one aspect of the present invention there is provided a process for fabricating a leadless plastic chip carrier. The process includes laminating a first copper strip to a second copper strip to form a leadframe strip, selectively etching the first copper strip to define at least a die attach pad and at least one row of contact pads, mounting a semiconductor die to the die attach pad and wire bonding the semiconductor die to ones of the contact pads, encapsulating a top surface of the leadframe strip in a molding material removing the second copper strip, thereby exposing the die attach pad and the at least one row of contact pads, and singulating the leadless plastic chip carrier from the leadframe strip In another aspect of the present invention, there is provided a process for fabricating a leadless plastic chip carrier. The process includes providing a first copper strip, depositing solder on an upper surface and a lower surface of a second copper strip, hot roll solder reflow joining of the first copper strip to the second copper strip, with a solder flux disposed between the copper strips, to solder bond the first copper strip and the second copper strip, thereby forming a leadframe strip, selectively plating at least one of silver, nickel/gold, and nickel/palladium to an upper surface of the first copper strip, in a pattern of at least one row of contact pads, depositing an etch-resist mask on a top surface of the leadframe strip, the portion of the upper surface forming a die attach pad, etching the top surface of the leadframe strip to define at least the die attach pad and the at least one row of contact pads, stripping off the etch-resist mask, mounting a semiconductor die to the die attach pad and wire bonding the semiconductor die to ones of the contact pads, encapsulating the top surface of the leadframe strip in a molding material, stripping the solder on the lower surface of the second copper strip, etching away the second copper strip, reflowing to separate solder plating from a bottom surface of the molding material, and singulating the leadless plastic chip carrier from the leadframe strip.

In still another aspect of the present invention, there is provided a process for fabricating a leadless plastic chip carrier. The process includes selectively plating at least one of silver, nickel/gold, and nickel/palladium to an upper surface of a first copper strip, in a pattern of at least one row of contact pads, depositing solder on an upper surface and a lower surface of a second copper strip, hot roll solder reflow joining of the first copper strip to the second copper strip, with a solder flux disposed between the copper strips, to solder bond the first copper strip and the second copper strip, thereby forming a leadframe strip, depositing an etch-resist mask on a top surface of the leadframe strip, the portion of the upper surface forming a die attach pad, etching the top surface of the leadframe strip to define at least the die attach pad and the at least one row of contact pads, stripping off the etch-resist mask, mounting a semiconductor die to the die attach pad and wire bonding the semiconductor die to ones of the contact pads, encapsulating the top surface of the leadframe strip in a molding material, stripping the solder on the lower surface of the second copper strip, etching away the second copper strip, reflowing to separate solder plating from a bottom surface of the molding material, and singulating the leadless plastic chip carrier from the leadframe.

In another aspect of the present invention, a process for fabricating a leadless plastic chip carrier is provided the process includes laminating a first metal strip to a second metal strip to form a leadframe strip, selectively etching said first metal strip to define at least a row of contact pads, mounting a semiconductor die to said second metal strip, on a same side thereof as said contact pads and wire bonding said semiconductor die to ones of said contact pads, encapsulating a top surface of said leadframe strip in a molding material, removing said second metal strip, thereby exposing said semiconductor die and said row of contact pads, and singulating the leadless plastic chip carrier from the leadframe strip.

In another aspect of the present invention, a process for fabricating a leadless plastic chip carrier is provided. The process includes providing a first metal strip, depositing one of tin and solder on an upper surface and a lower surface of a second metal strip, hot roll solder reflow joining of said first metal strip to said second metal strip, with a solder flux disposed between the metal strips, to solder bond said first metal strip and said second metal strip, thereby forming a leadframe strip, selectively plating at least one of silver, nickel/gold, and nickel/palladium to an upper surface of said first copper strip, in a pattern of at least one row of contact pads, etching said top surface of said leadframe strip to define said at least one row of contact pads, mounting a semiconductor die to said second metal strip and wire bonding said semiconductor die to ones of said contact pads, encapsulating said top surface of said leadframe strip in a molding material, stripping said one of tin and solder on said lower surface of said second metal strip, removing said second metal strip, reflowing to separate said one of tin and solder from a bottom surface of the molding material, and singulating the leadless plastic chip carrier from the leadframe strip.

In yet another aspect, a process for fabricating a leadless plastic chip carrier is provided. The process includes selectively plating at least one of silver, nickel/gold, and nickel/palladium to an upper surface of a first metal strip, in a pattern of at least one row of contact pads, depositing one of tin and solder on an upper surface and a lower surface of a second metal strip, hot roll solder reflow joining of said first metal strip to said second metal strip, with a solder flux disposed between the metal strips, to solder bond said first metal strip and said second metal strip, thereby forming a leadframe strip, etching said top surface of said leadframe strip to define said at least one row of contact pads, mounting a semiconductor die to said second metal strip and wire bonding said semiconductor die to ones of said contact pads, encapsulating said top surface of said leadframe strip in a molding material, stripping said one of tin and solder on said lower surface of said second metal strip, etching away said second metal strip, reflowing to separate said one of tin and solder from a bottom surface of the molding material, and singulating the leadless plastic chip carrier from the leadframe.

Advantageously, a robust three dimensional structure results from laminating a pair of strips of copper and selectively etching back the copper to leave the die attach pad, the power ring and the I/O contacts. The process therefore includes etching back rather than a deposition stage to form the contacts, the power ring and the die attach pad. Also, it is not necessary to use gold as an etch resist or as a bondable surface, thus resulting in material cost savings.

BRIEF DESCRIPTION OF THE DRAWINGS

The invention will be better understood with reference to the following drawings, in which.

DETAILED DESCRIPTION OF THE PREFERRED EMBODIMENTS

Figure 1G:
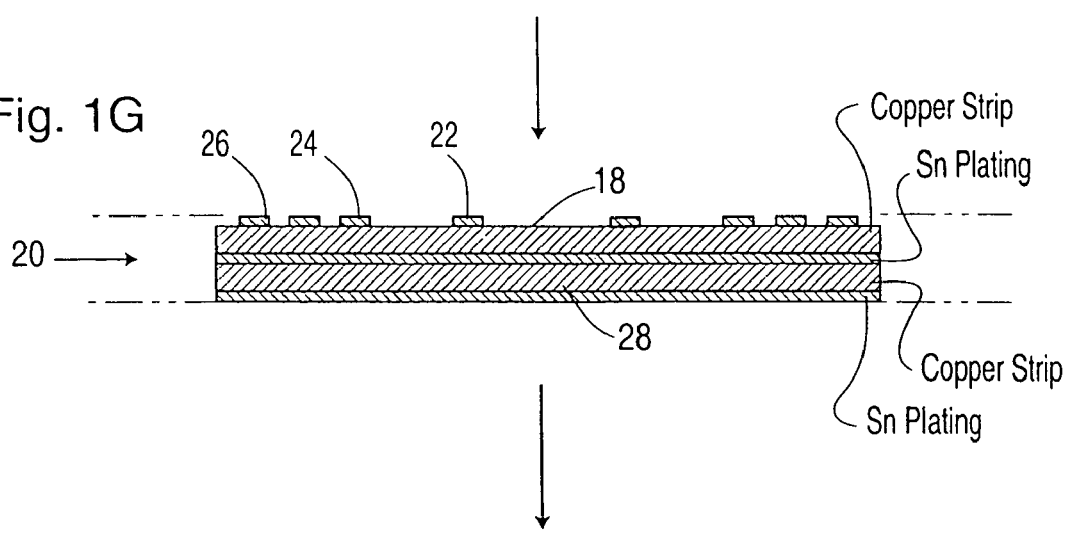
FIGS. 1A to 1O show a process for manufacturing a leadless plastic chip carrier, according to a first embodiment of the invention.

Reference is made to FIGS. 1A to 1L which show the process for manufacturing a leadless plastic chip carrier (LPCC) according to a first embodiment of the present invention. Referring first to FIG. 1A, an elevation view is provided of a first metal strip 18 that forms a part of the raw material of the leadframe strip (indicated generally by the numeral 20 in FIG. 1G). In the present embodiment, the metal strip 18 is a copper strip. As discussed in greater detail in Applicant's own U.S. Pat. No. 6,229,200, issued May 8, 2001, the contents of which are incorporated herein by reference, the leadframe strip 20 is divided into a plurality of sections. Each of the sections incorporates a plurality of leadframe units in an array (e.g. 3×3 array, 5×5 array, etc.). Only one such unit is depicted in the elevation views of the Figures, portions of adjacent units being shown by stippled lines.

The metal strip 18 is selectively plated with a preplating metal using plating resist to define the plating areas. Preferably, the preplating metal is silver (Ag), nickel and gold (Ni/Au) or nickel and palladium (Ni/Pd) (FIG. 1B). The preplating metal is selectively plated in a pattern of a ground ring pad 22, a power ring 24, and contact or I/O pads 26.

Referring to FIG. 1C, an elevation view is provided of a second metal strip 28 that forms a second part of the raw material of the leadframe strip 20. In the present embodiment, the second metal strip 28 is a copper strip. The second metal strip 28 is similar to the first metal strip 18 and therefore need not be further described herein.

The second metal strip 28 is plated with tin (Sn) or solder on both upper and lower surfaces thereof (FIG. 1D). The coating serves to enhance lamination and etching resist.

Next, a solder flux is applied to the top, tin-plated surface of the second metal strip 28 (FIG. 1E). In an alternative embodiment, flux is applied to the bottom surface of the first metal strip 18.

The first and second metal strips 18, 28, respectively, are then laminated together by hot rolling with the solder flux disposed therebetween (FIGS. 1F and 1G). The hot rolling causes the plated tin or solder to reflow and wet the bottom surface of the first metal strip 18, thereby solder bonding the first metal strip 18 to the second metal strip 28. After hot rolling, the leadframe strip 20 is subjected to flux cleaning by conventional flux cleaning techniques.

Figure 1H:
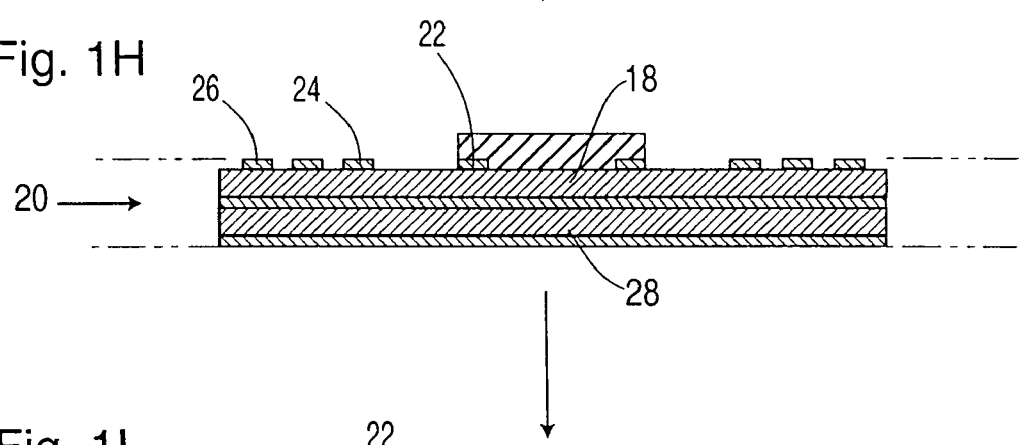
Figure 1I:
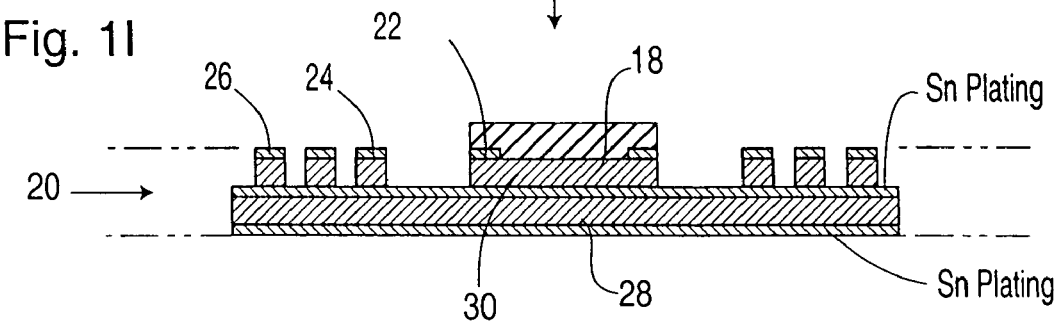
Figure 1J:
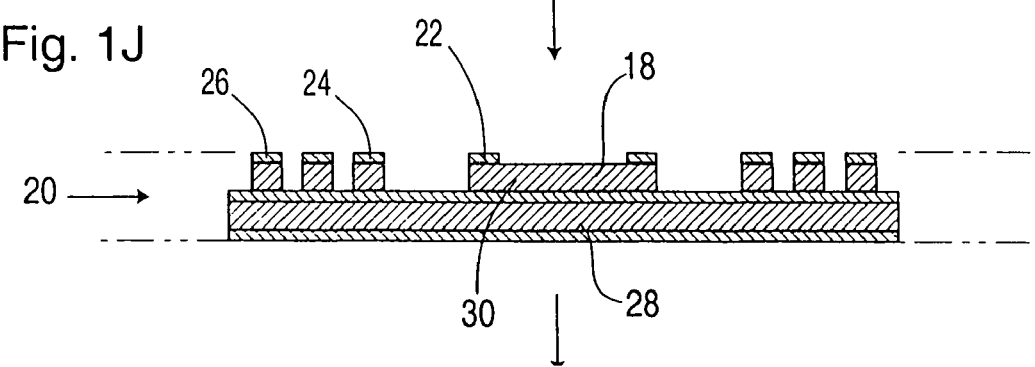

Next, an etching mask is selectively applied to the top of a die attach pad portion of the first metal strip 18 (FIG. 1H). In the present embodiment, the etching mask is a photo-imageable etch resist such as a photo-imageable epoxy that is spin coated on the leadframe strip and selectively exposed to light using a photo-tool for masking. The exposed portions are then removed and the leadframe strip 20 is subjected to a chemical etch (FIG. 1I). In the present embodiment, the chemical etch is an alkaline etch that selectively etches away the metal to define the power ring 24, the contact pads 26, as well as the die attach pad 30 and the ground ring 22 under the etching mask. The etching mask is then stripped from the die attach pad 30 and the ground ring 22 (FIG. 1J).

Figure 1K:
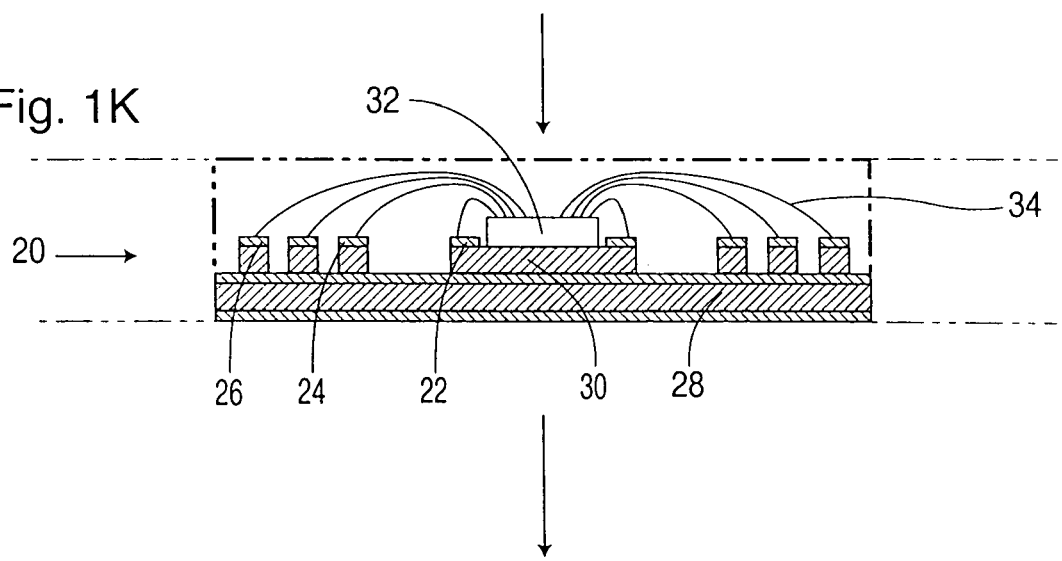

Referring to FIG. 1K, a singulated semiconductor die 32 is mounted to the die attach pad 30, using known techniques. In the present embodiment, solder paste is dispensed on the die attach pad 30 and the semiconductor die 32 is attached by a solder reflow technique. The semiconductor die 32 is coated with a suitable surface for soldering, such as titanium (Ti), tungsten (W) or gold (Au) for mounting by solder reflow. In an alternative embodiment, the die is attached using a silver-filled epoxy, as will be understood by those skilled in the art.

Wires 34 are then bonded between the semiconductor die 32 and the ground ring 22, between the semiconductor die 32 and the power ring 24, and between the semiconductor die 32 and the contact pads 26. The wires 34 are made of a suitable wire-bonding material such as gold (Au), copper (Cu), aluminum (Al) or doped aluminum. The preplated silver (Ag), nickel/gold (NiAu) or nickel/palladium (Ni/Pd) facilitates wire bonding to the ground ring 22, the power ring 24 and the contact pads 26. The leadframe 20 is then molded using a modified mold with the bottom cavity being a flat plate, and subsequently cured, as discussed in applicant's U.S. Pat. No. 6,229,200, the contents of which are incorporated herein by reference.

Figure 1L:
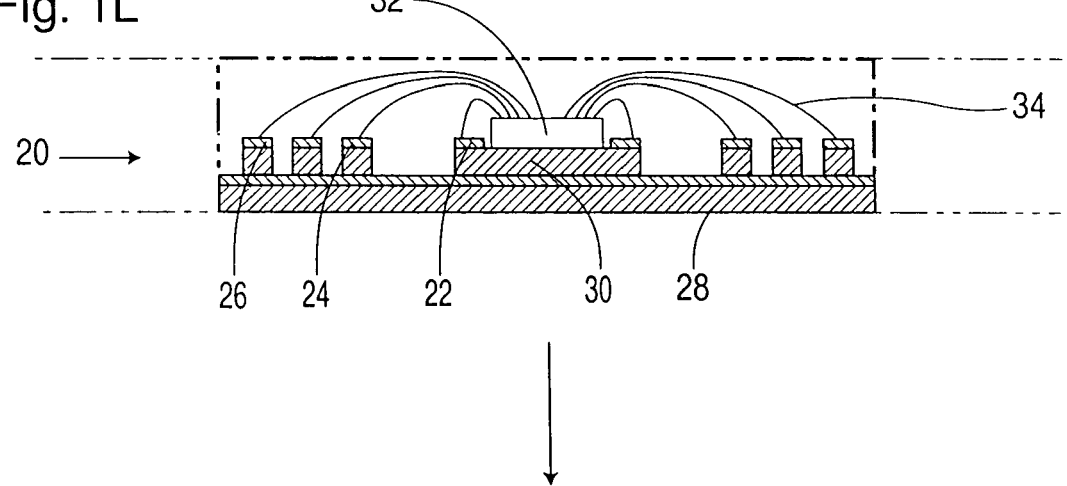
Figure 1M:
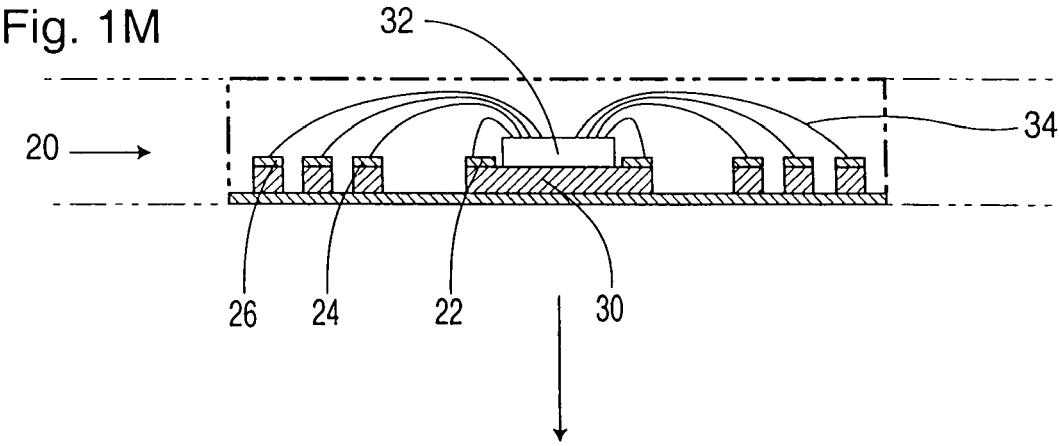

Next, the tin or solder plating is stripped from the bottom surface of the leadframe 20 (the lower surface of the second metal strip 28) (FIG. 1L). The metal at the bottom surface of the leadframe strip 20 is then removed. In the present embodiment, the metal is removed by subjecting the leadframe 20 to an alkaline etch (FIG. 1M).

A solder reflow technique is used to separate the tin or solder plating on the bottom surface of the mold compound, leaving tin or solder plating on the lower surfaces of the die attach pad 30, the power ring 24 and the contact pads 26 (FIG. 1N).

Singulation of the individual units from the full leadframe array strip is then performed either by saw singulation or die punching resulting in the final configuration shown in FIG. 1O.

Figure 2F:
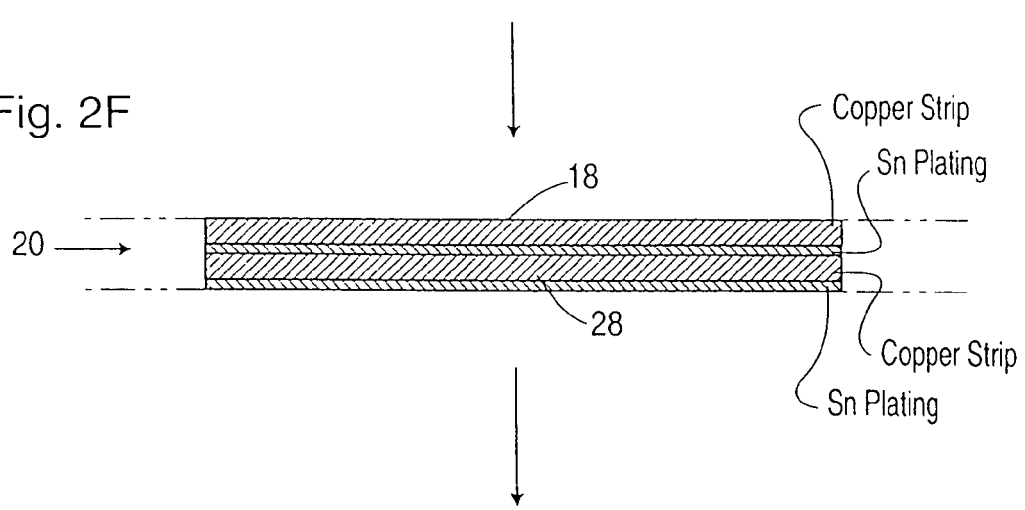
FIGS. 2A to 2O show a process for manufacturing a leadless plastic chip carrier, according to a second embodiment of the invention.

Reference is now made to FIGS. 2A–2O which show a process for manufacturing a Leadless Plastic Chip Carrier (LPCC), according to a second embodiment of the invention. Referring to FIG. 2A, an elevation view is provided of a first metal strip 18 that forms a part of the raw material of the leadframe strip (indicated generally by the numeral 20 in FIG. 2F).

Referring to FIG. 2B, an elevation view is provided of a second metal strip 28 that forms a second part of the raw material of the leadframe strip 20. The second metal strip 28 is similar to the first metal strip 18 and therefore need not be further described herein. Similar to the first embodiment, the second copper strip 28 of the present embodiment is plated with tin (Sn) or solder on both upper and lower surfaces thereof (FIG. 2C). The coating serves to enhance lamination and etching resist.

Next, a solder flux is applied to the top, tin-plated surface of the second metal strip 28 (FIG. 2D). Alternatively, flux is applied to the bottom surface of the first metal strip 18.

The first and second metal strips 18, 28, respectively, are then laminated together by hot rolling with the solder flux disposed therebetween (FIGS. 2E and 2F). The hot rolling causes the plated tin or solder to reflow and wet the bottom surface of the first metal strip 18, thereby solder bonding the first metal strip 18 to the second metal strip 28. After hot rolling, the leadframe strip 20 is subjected to flux cleaning by conventional flux cleaning techniques.

Figure 2G:
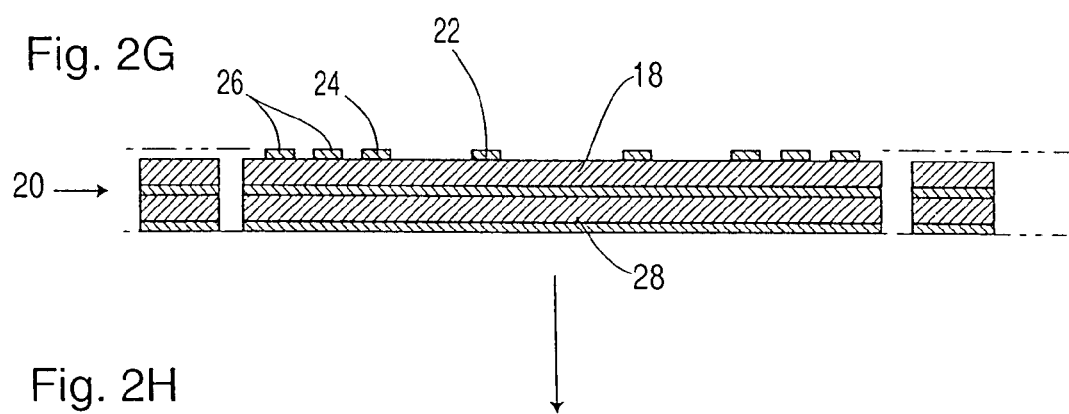
Figure 2H:
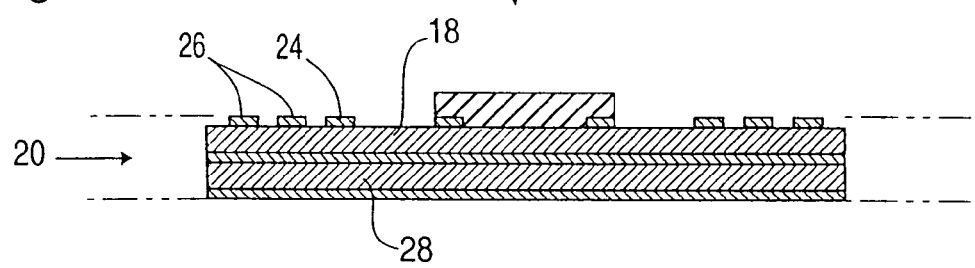
Figure 2I:
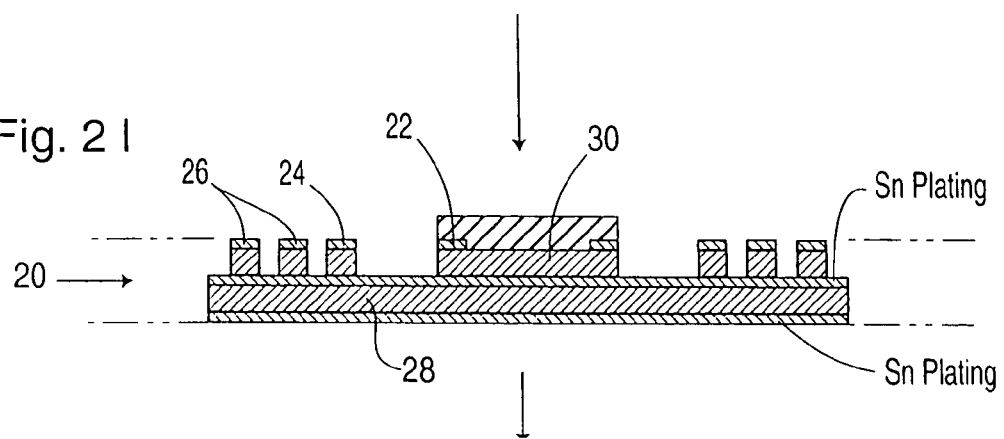
Figure 2J:
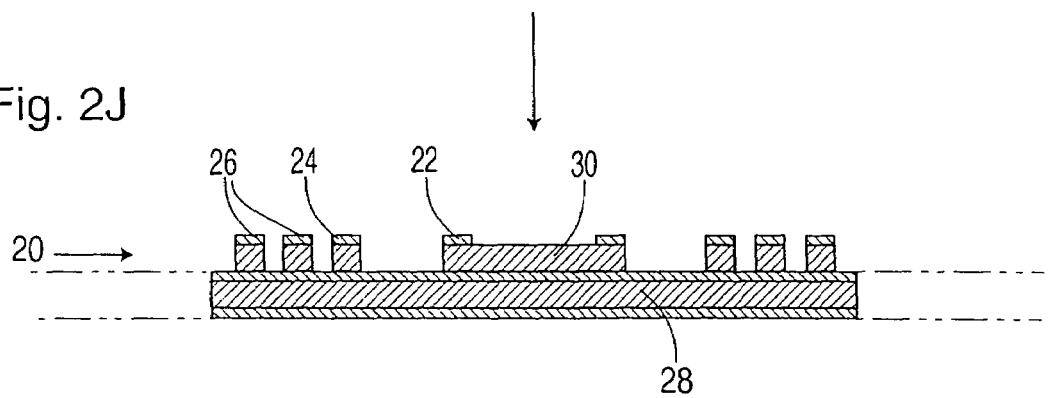
Figure 2K:
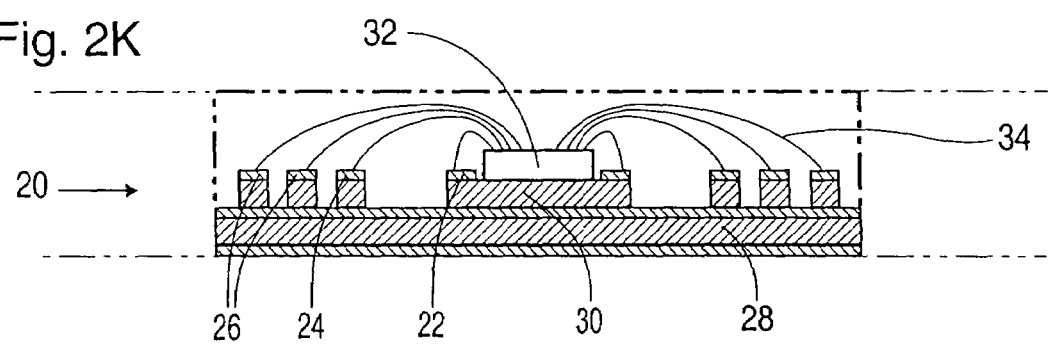
Figure 2L:
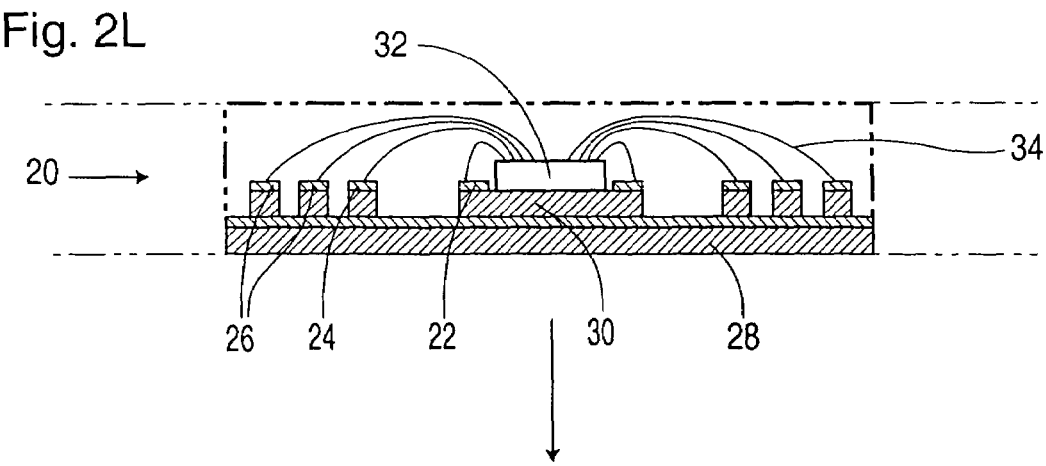

Next, the first metal strip 18 is selectively plated with a preplating metal such as silver (Ag), nickel/gold (Ni/Au) or nickel/palladium (Ni/Pd) (FIG. 2G). The preplating metal is selectively plated in a pattern of a ground ring pad 22, a power ring 24, and contact or I/O pads 26.

The process steps shown in FIGS. 2H to 2O are similar to the process steps shown in FIGS. 1H to 1O described herein above, and therefore need not be further described herein.

Figure 3:
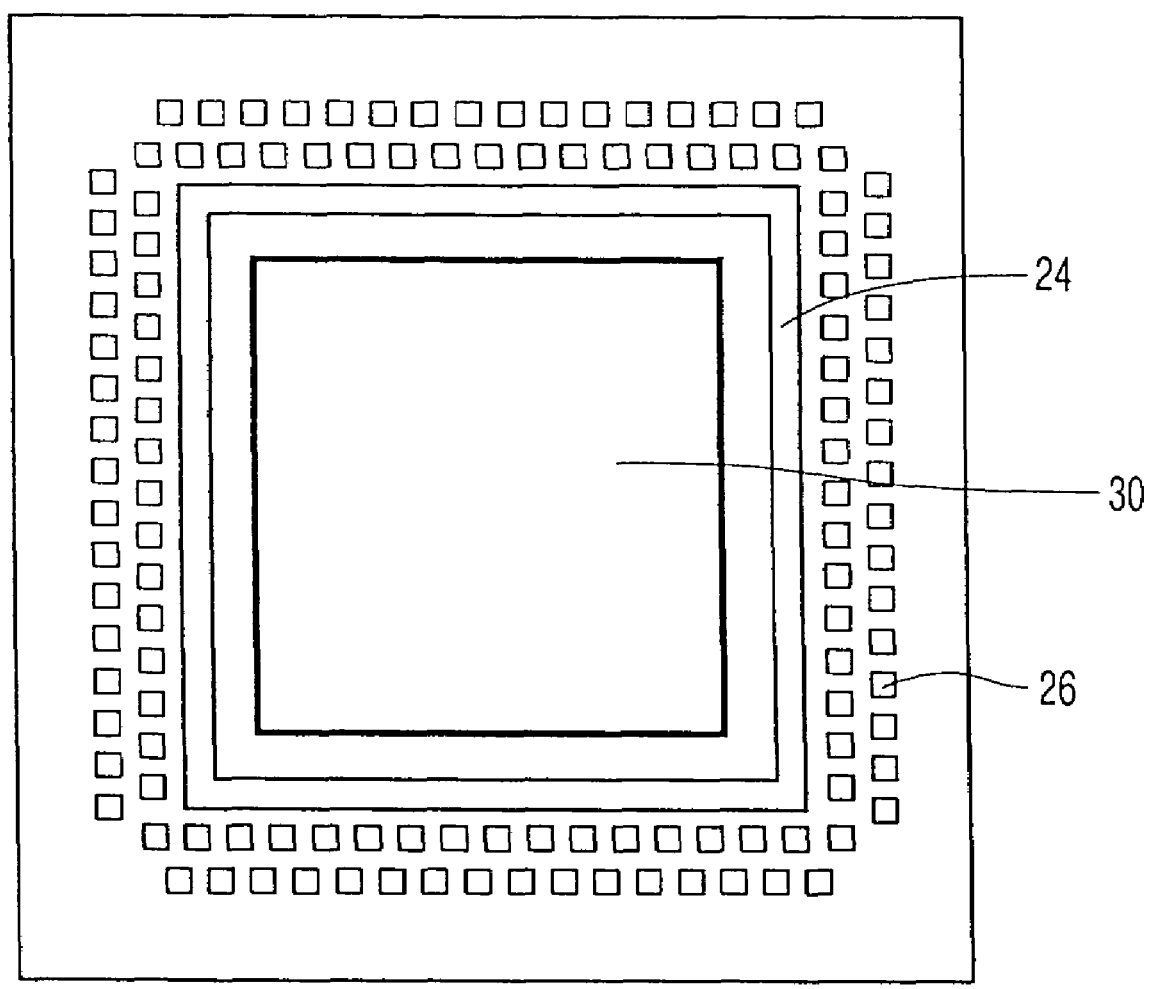
FIG. 3 shows a bottom view of the leadless plastic chip carrier of FIG. 1O.

Reference is now made to FIG. 3 which shows a bottom view of the LPCC of FIG. 1O, including the underside of the die attach pad 30, the power ring 24 and the contact or I/O pads 26.

Figure 4A:
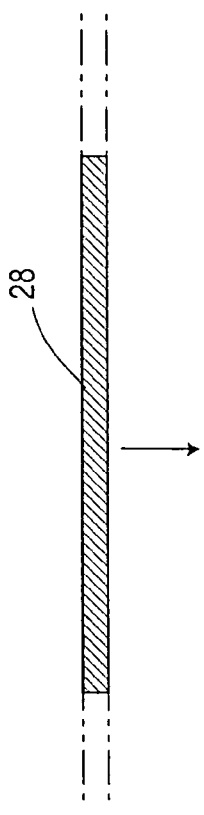
FIGS. 4A to 4M show a process for manufacturing a leadless plastic chip carrier, according to a third embodiment of the invention.

Reference is now made to FIGS. 4A to 4M to describe a process for manufacturing a LPCC according to a third embodiment of the present invention. Referring first to FIG. 4A, an elevation view is provided of a first metal strip 18 that forms part of the raw material of the leadframe strip (indicated generally by the numeral 20 in FIG. 4G). In the present embodiment, the metal strip 18 is a copper strip.

Figure 4B:
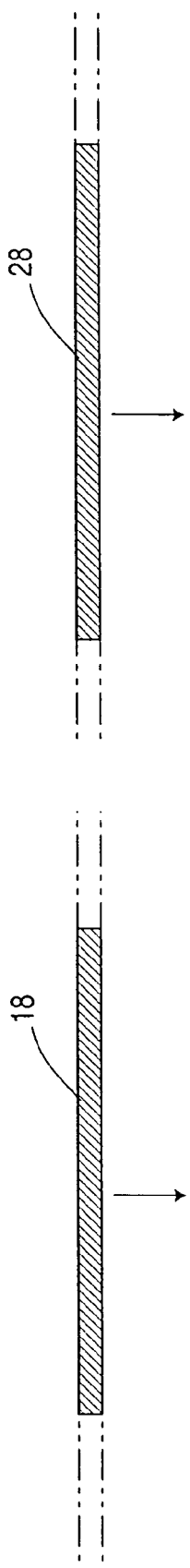

The metal strip 18 is selectively plated with a preplating metal using plating resist to define the plating areas. As previously described, the preplating metal is preferably silver (Ag), nickel and gold (Ni/Au) or nickel and palladium (Ni/Pd) (FIG. 4B). The preplating metal is selectively plated in a pattern of a power ring 24, and contact or I/O pads 26. Note that no ground ring is provided in the present embodiment.

Figure 4C:
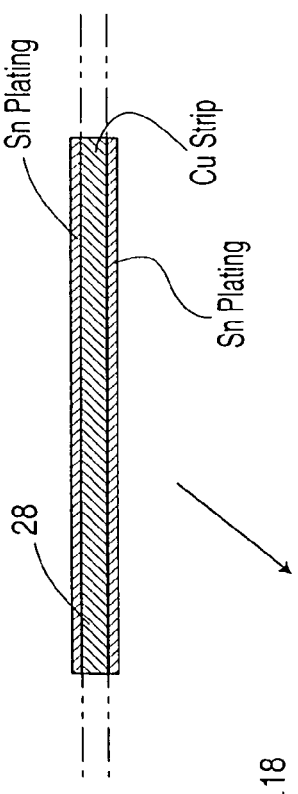

Referring to FIG. 4C, an elevation view is provided of a second metal strip 28 that forms a second part of the raw material of the leadframe strip 20. In the present embodiment, the second metal strip 28 is also a copper strip. The second metal strip 28 is similar to the first metal strip 18 and therefore need not be further described herein.

Figure 4D:
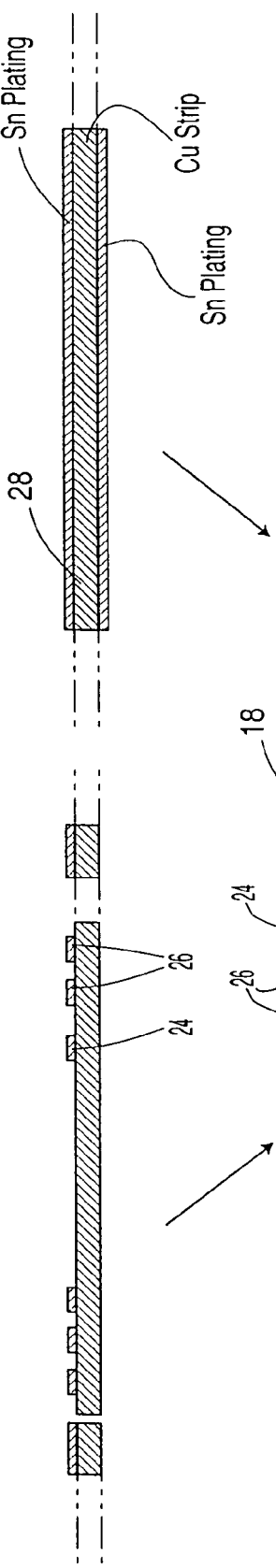

The second metal strip 28 is plated with tin (Sn) or solder on both upper and lower surfaces thereof (FIG. 4D). The coating serves to enhance lamination and etching resist.

Figure 4E:
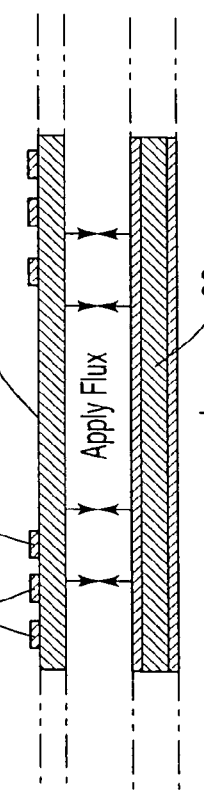

Next, a solder flux is applied to the top, tin-plated surface of the second metal strip 28 (FIG. 4E). In an alternative embodiment, flux is applied to the bottom surface of the first metal strip 18.

Figure 4F:
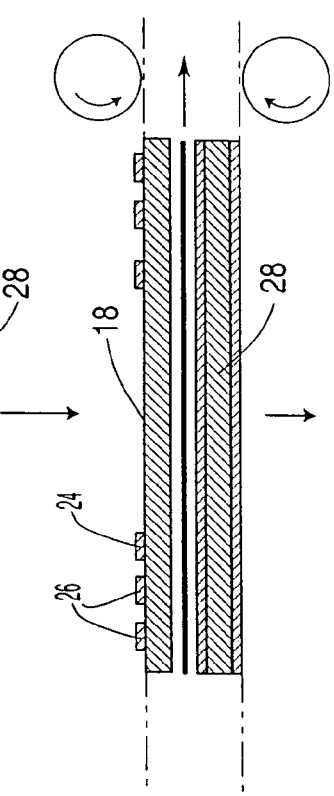
Figure 4G:
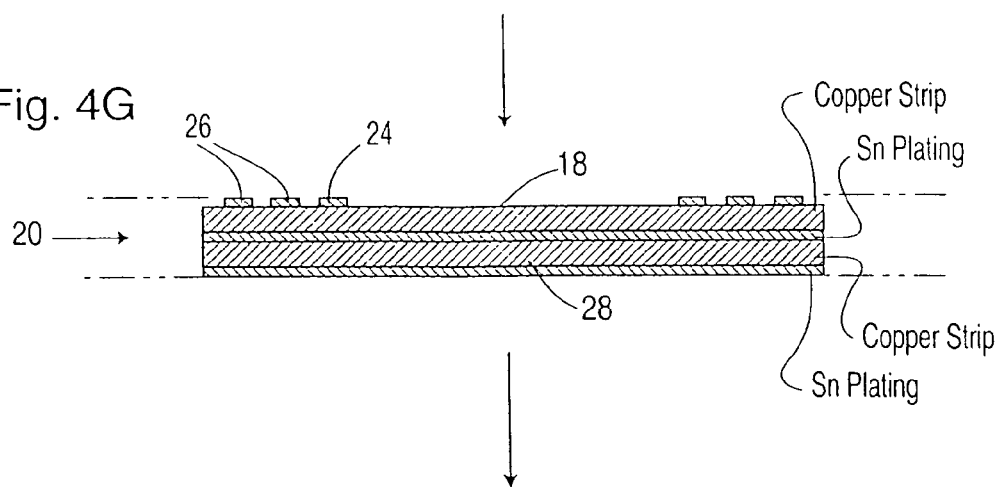

The first and second metal strips 18, 28, respectively, are then laminated together by hot rolling with the solder flux disposed therebetween (FIGS. 4F and 4G). The hot rolling causes the plated tin or solder to reflow and wet the bottom surface of the first metal strip 18, thereby solder bonding the first metal strip 18 to the second metal strip 28. After hot rolling, the leadframe strip 20 is subjected to flux cleaning by conventional flux cleaning techniques.

Figure 4H:
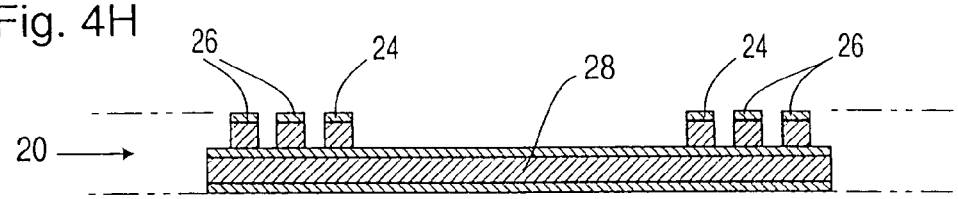

Next, the leadframe strip 20 is subjected to a chemical etch (FIG. 4H). In the present embodiment, the chemical etch is an alkaline etch that selectively etches away the metal to define the power ring 24, and the contact pads 26. Unlike the first described embodiment, no die attach pad is formed.

Figure 4I:
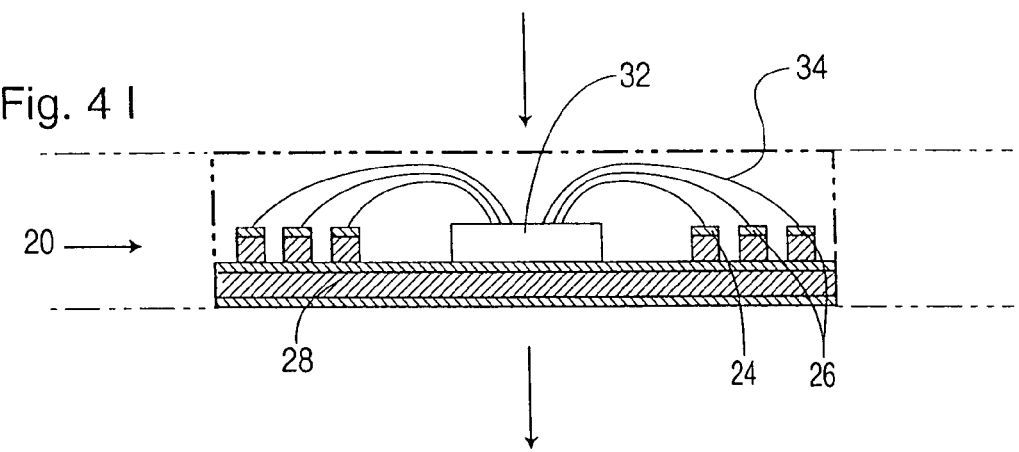

Referring to FIG. 4I, a singulated semiconductor die 32 is mounted to the plated second metal strip 28, in the center of the power ring 24 using known die attach techniques. In the present embodiment, solder paste is dispensed on the plated second metal strip 28 and the semiconductor die 32 is attached by a solder reflow technique. The semiconductor die 32 is coated with a suitable surface for soldering, such as titanium (Ti), tungsten (W) or gold (Au) for mounting by solder reflow. In an alternative embodiment, the die is attached using a silver-filled epoxy, as will be understood by those skilled in the art.

Wires 34 are then bonded between the semiconductor die 32 and the power ring 24, and between the semiconductor die 32 and the contact pads 26. The wires 34 are a suitable wire-bonding material such as gold (Au), copper (Cu), aluminum (Al) or doped aluminum. The preplated silver (Ag), nickel/gold (NiAu) or nickel/palladium (Ni/Pd) facilitates wire bonding to the power ring 24 and the contact pads 26. The leadframe 20 is then molded using a modified mold with the bottom cavity being a flat plate, and subsequently cured.

Figure 4J:
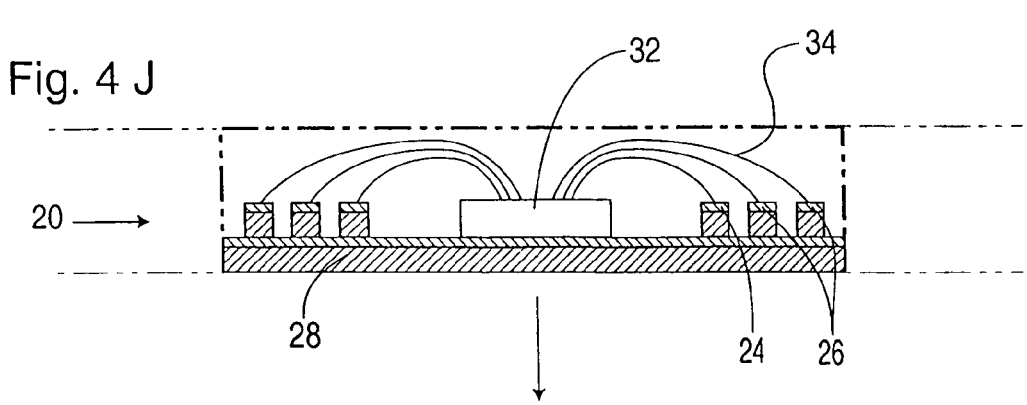
Figure 4:
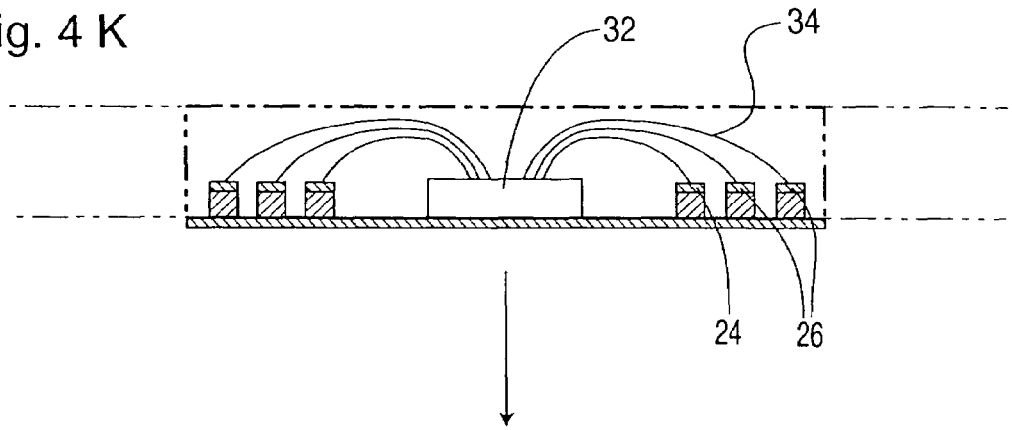
Figure 4:
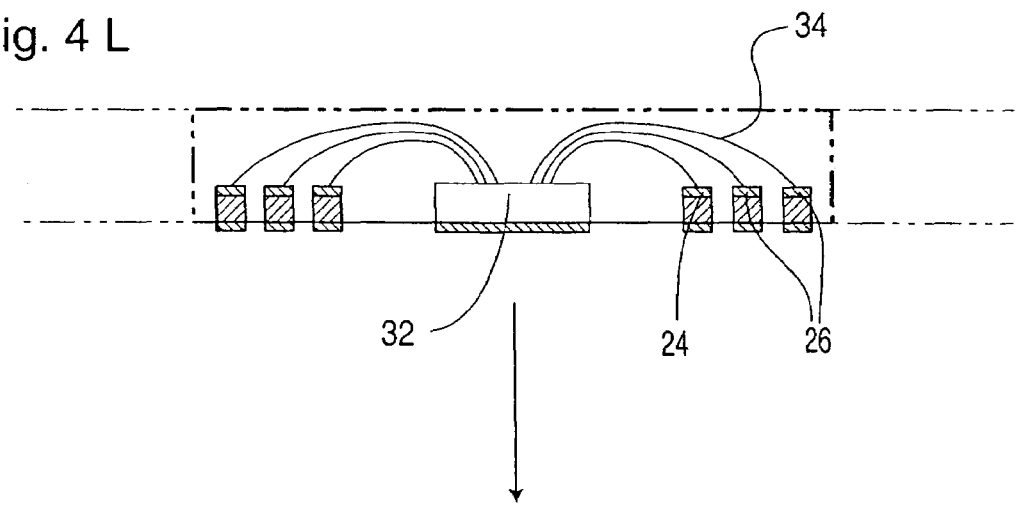
Figure 4:
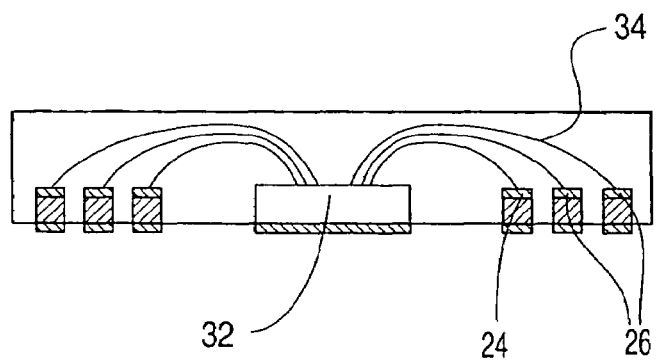

Next, the tin or solder plating is stripped from the bottom surface of the leadframe 20 (the lower surface of the second metal strip 28) (FIG. 4J). The metal at the bottom surface of the leadframe strip 20 is then removed. In the present embodiment, the metal is removed by subjecting the leadframe 20 to an alkaline etch (FIG. 4K).

A solder reflow technique is used to separate the tin or solder plating on the bottom surface of the mold compound, leaving tin or solder plating on the lower surfaces of the semiconductor die 32, the power ring 24 and the contact pads 26 (FIG. 4L).

Singulation of the individual units from the full leadframe array strip is then performed either by saw singulation or die punching resulting in the final configuration shown in FIG. 4M.

Figure 5:
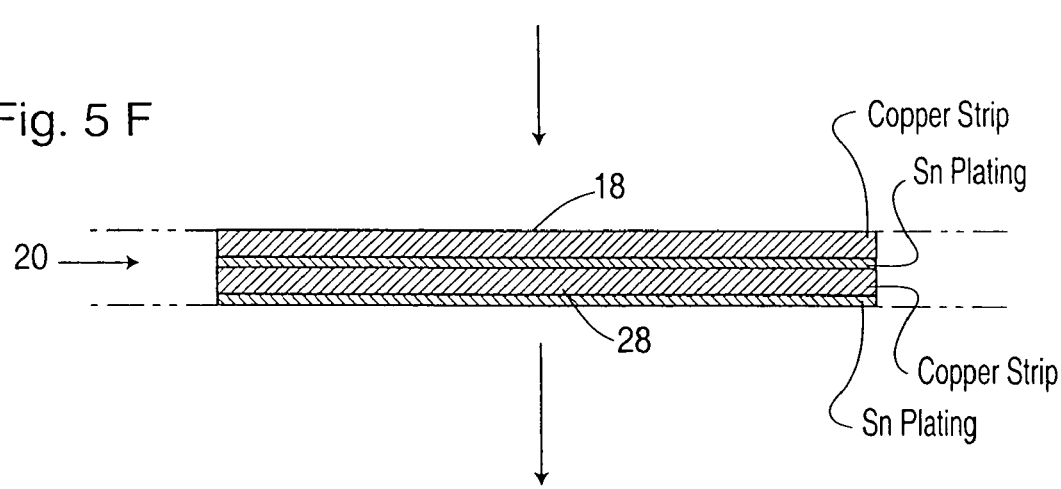
FIGS. 5A to 5M show a process for manufacturing a leadless plastic chip carrier, according to fourth embodiment of the present invention.
Figure 5:
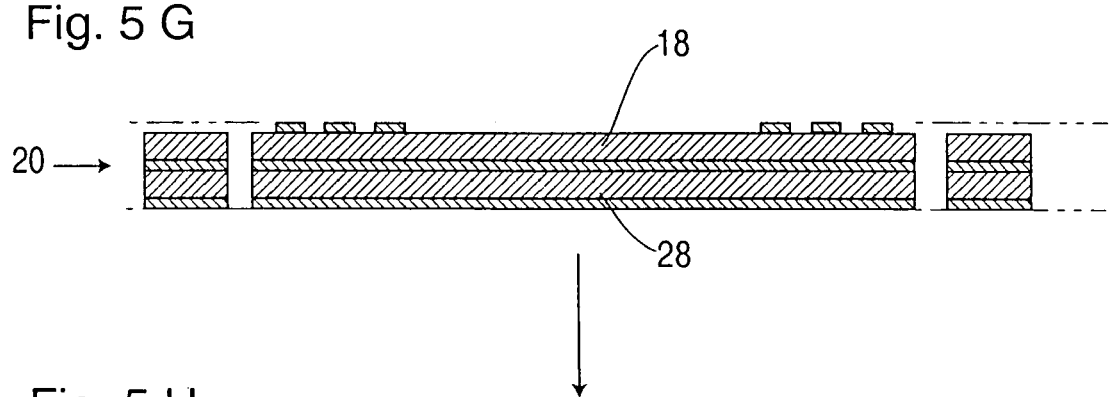
Figure 5:
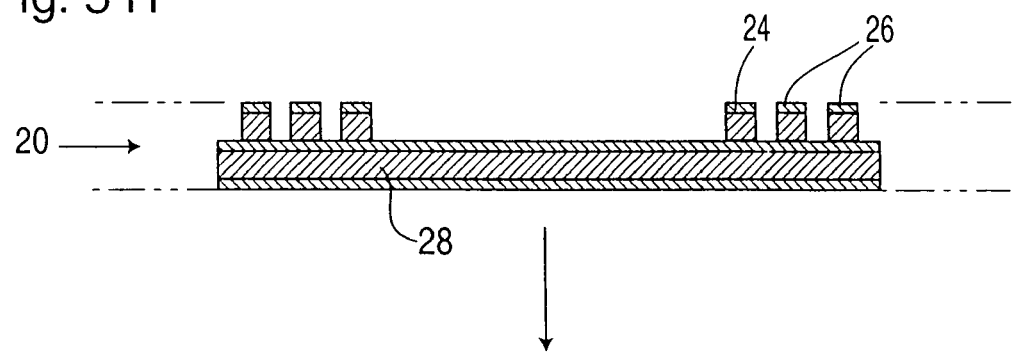
Figure 5:
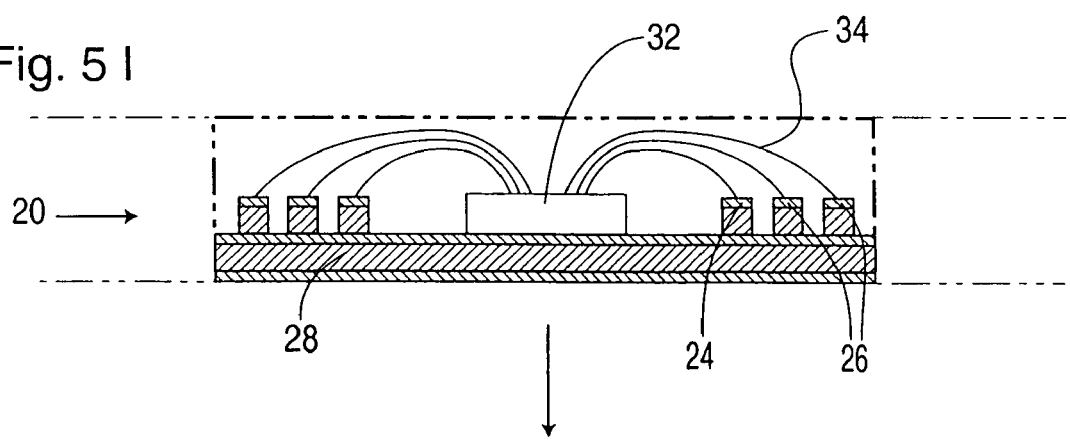
Figure 5:
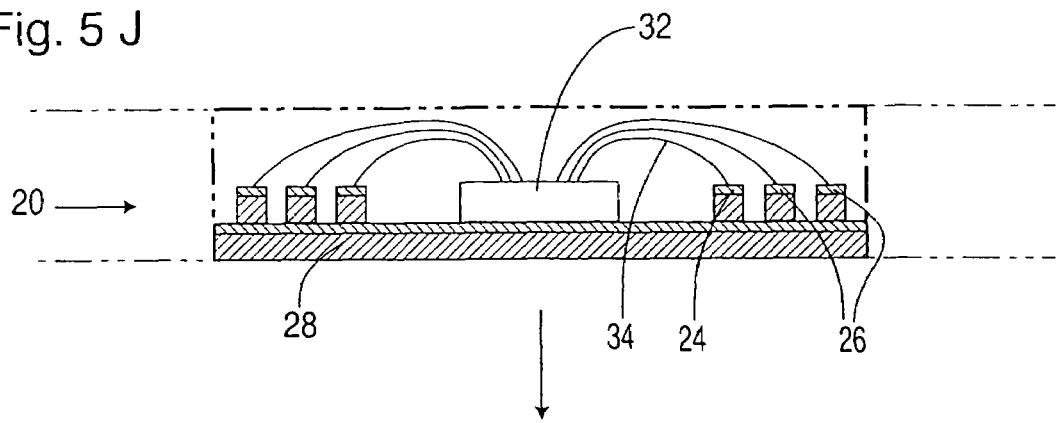
Figure 5:
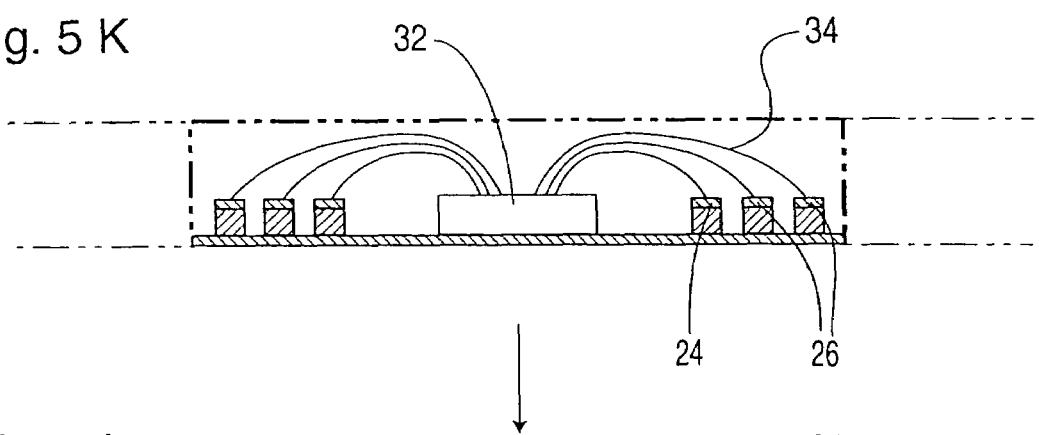
Figure 5:
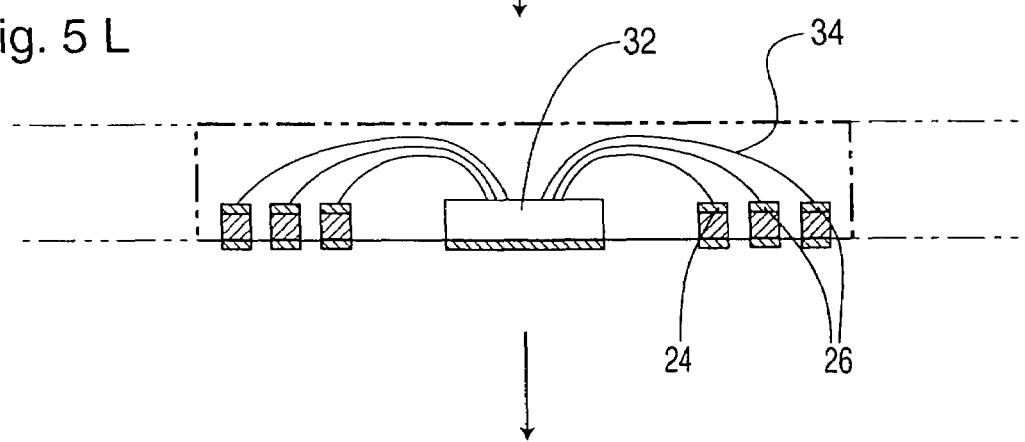
Figure 5:
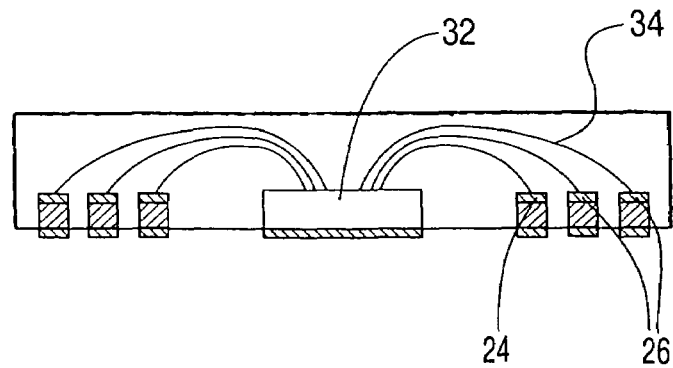

Reference is now made to FIGS. 5A–5M which show a process for manufacturing a Leadless Plastic Chip Carrier (LPCC), according to a fourth embodiment of the present invention. Referring to FIG. 5A, an elevation view is provided of a first metal strip 18 that forms a part of the raw material of the leadframe (strip indicated generally by the numeral 20 in FIG. 5G).

Referring to FIG. 5B, an elevation view is provided of a second metal strip 28 that forms a second part of the raw material of the leadframe strip 20. The second metal strip 28 is similar to the first metal strip 18 and need not be further described herein. Similar to the first embodiment, the second copper strip 28 of the present embodiment is plated with tin (Sn) or solder on both upper and lower surfaces thereof (FIG. 5C). The coating serves to enhance lamination and etching resist.

Next, a solder flux is applied to the top, tin-plated surface of the second metal strip 28 (FIG. 5D). Alternatively, flux is applied to the bottom surface of the first metal strip 18.

The first and second metal strips 18, 28, respectively, are then laminated together by hot rolling with the solder flux disposed therebetween (FIGS. 5E and 5F). The hot rolling causes the plated tin or solder to reflow and wet the bottom surface of the first metal strip 18, thereby solder bonding the first metal strip 18 to the second metal strip 28. After hot rolling, the leadframe strip 20 is subjected to flux cleaning by conventional flux cleaning techniques.

Next, the first metal strip 18 is selectively plated with a preplating metal such as silver (Ag), nickel/gold (Ni/Au) or nickel/palladium (Ni/Pd) (FIG. 5G). The preplating metal is selectively plated in a pattern of a power ring 24, and contact or I/O pads 26.

The process steps shown in FIGS. 5H to 5M are similar to the process steps shown in FIGS. 4H to 4M described herein above, and therefore need not be further described herein.

Figure 1:
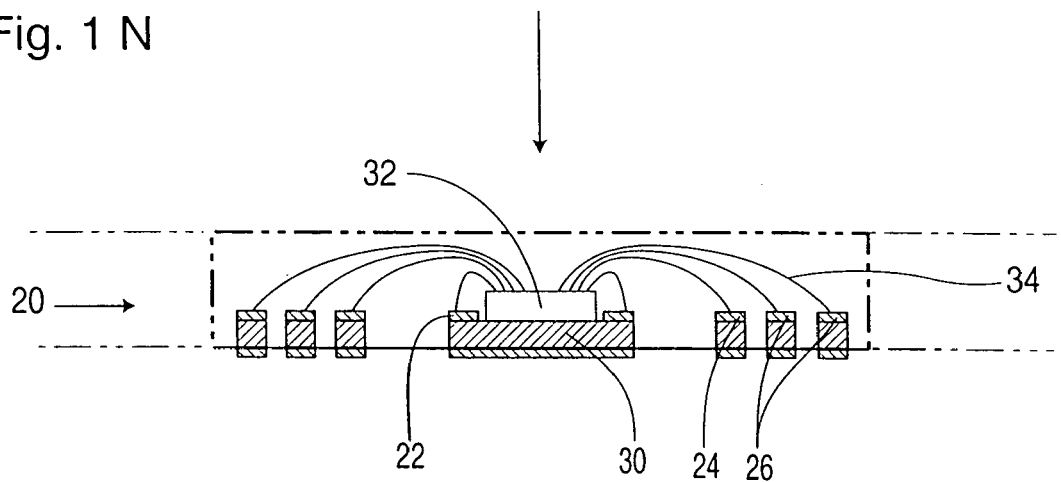
Figure 1:
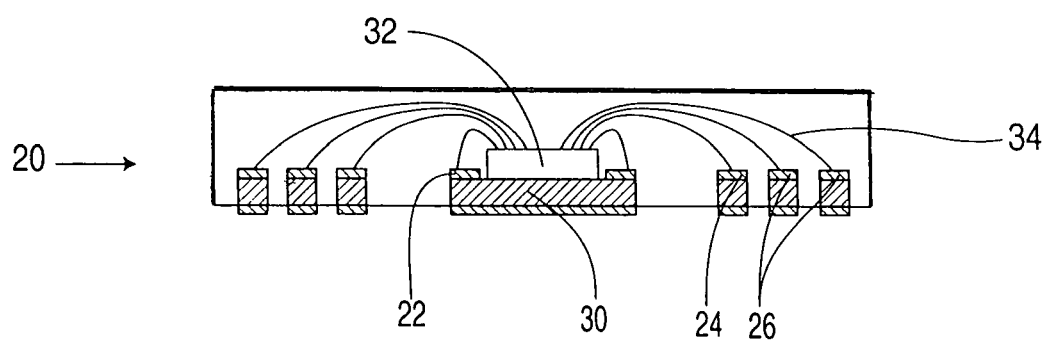
Figure 2:
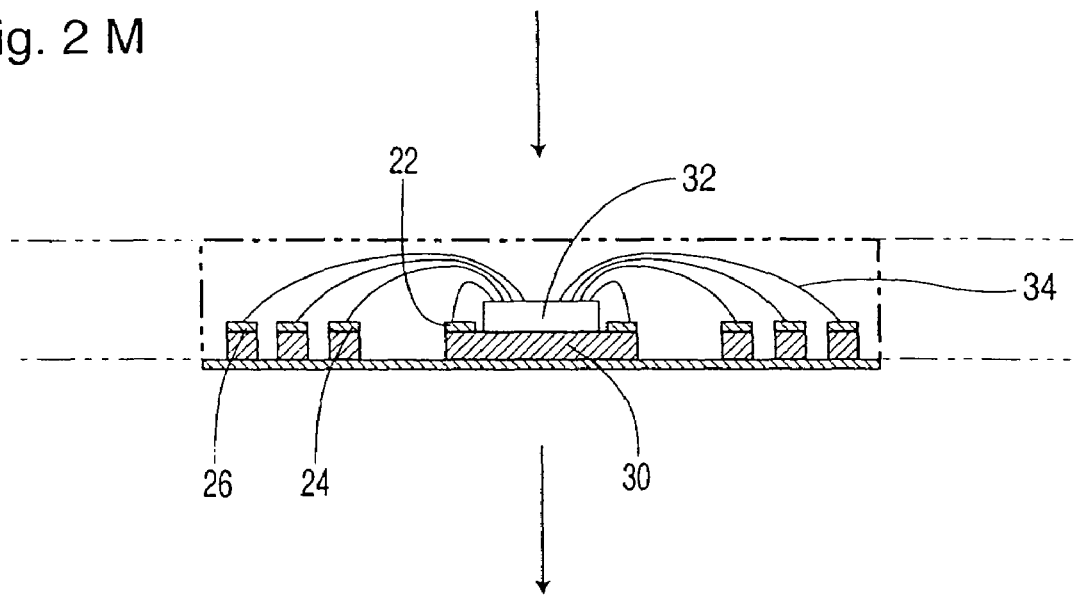
Figure 2:
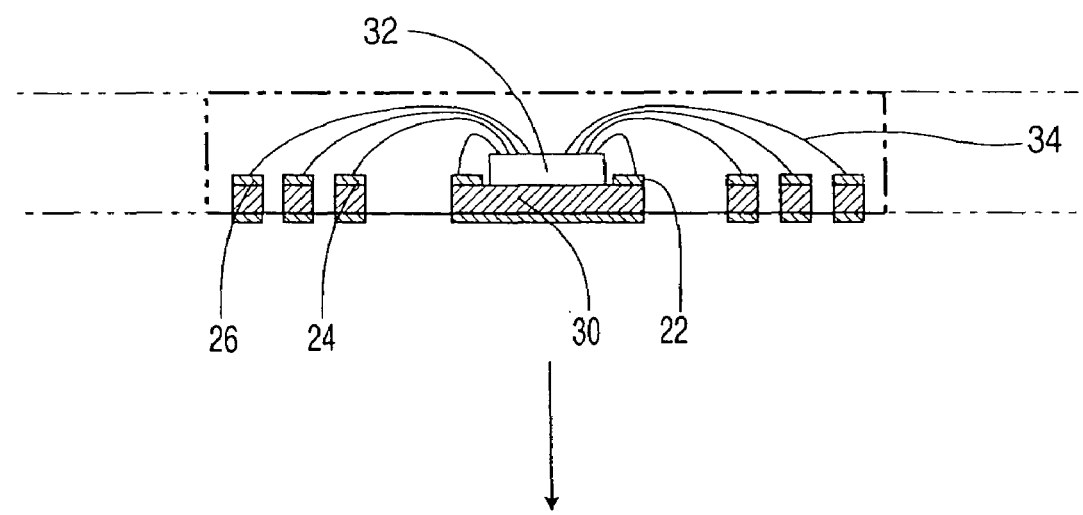
Figure 2:
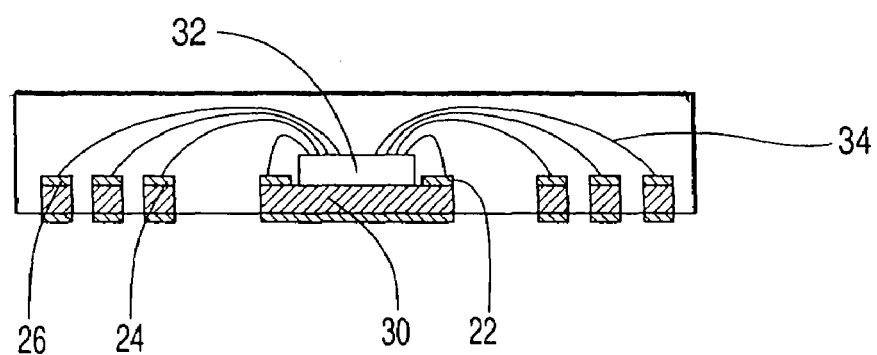

Specific embodiments of the present invention have been shown and described herein. However, modifications and variations to these embodiments are possible. For example, the leadframe strip is not limited to copper and can be any suitable metal such as an iron-based alloy. Also, in the embodiments of FIGS. 1 and 2, the metal at the bottom surface of the leadframe strip is removed by subjecting the leadframe to an alkaline etch. The bottom strip can be removed in other ways. For example, the bottom strip can be removed by heating to detach the bottom strip. Also, the step of flux cleaning is not necessary. Those skilled in the art may conceive of many other modifications and variations, all of which are believed to be within the scope and sphere of the present invention.

What is claimed is:

1. A process for fabricating a leadless plastic chip carrier, comprising:
    providing a first metal strip; depositing one of tin and solder on an upper surface and a lower surface of a second metal strip;
    hot roll solder reflow joining of said first metal strip to said second metal strip, with a solder flux disposed between the metal strips, to solder bond said first metal strip and said second metal strip, thereby forming a leadframe strip;
    selectively plating at least one of silver, nickel/gold, and nickel/palladium to an upper surface of said first copper strip, in a pattern of at least one row of contact pads;
    depositing an etch-resist mask on a top surface of said leadframe strip, said portion of said upper surface forming a die attach pad;
    etching said top surface of said leadframe strip to define at least said die attach pad and said at least one row of contact pads;
    stripping off said etch-resist mask: mounting a semiconductor die to said die attach pad and wire bonding said semiconductor die to ones of said contact pads;
    encapsulating said top surface of said leadframe strip in a molding material: stripping said one of tin and solder on said lower surface of said second metal strip;
    removing said second metal strip; reflowing to separate said one of tin and solder from a bottom surface of the molding material; and
    singulating the leadless plastic chip carrier from the leadframe strip.

2. The process for fabricating a leadless plastic chip carrier according to claim 1, wherein said step of removing said second metal strip comprises etching away said second metal strip.

3. The process for fabricating a leadless plastic chip carrier according to claim 1, wherein said step of removing said second metal strip comprises heating to detach said second metal strip.

* * * * *